(12) United States Patent  
Matsumoto et al.

(10) Patent No.: US 11,183,576 B2
(45) Date of Patent: Nov. 23, 2021

(54) GATE ELECTRODE LAYOUT WITH EXPANDED PORTIONS OVER ACTIVE AND ISOLATION REGIONS

(71) Applicant: Micron Technology, Inc., Boise, ID (US)

(72) Inventors: Hirokazu Matsumoto, Asaka (JP); Ryota Suzuki, Zama (JP); Makoto Sato, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/275,137

(22) Filed: Feb. 13, 2019

(65) Prior Publication Data

US 2020/0258992 A1 Aug. 13, 2020

(51) Int. Cl.
| | |
|---|---|
| *H01L 29/423* | (2006.01) |
| *H01L 29/06* | (2006.01) |
| *H01L 27/092* | (2006.01) |
| *H01L 29/66* | (2006.01) |

(52) U.S. Cl.
CPC ........ *H01L 29/4238* (2013.01); *H01L 27/092* (2013.01); *H01L 29/0642* (2013.01); *H01L 29/42356* (2013.01); *H01L 29/42376* (2013.01); *H01L 29/66545* (2013.01)

(58) Field of Classification Search
CPC .............. H01L 29/4238; H01L 27/092; H01L 29/0642; H01L 29/42356; H01L 29/66545
See application file for complete search history.

(56) References Cited

U.S. PATENT DOCUMENTS

| | | | | |
|---|---|---|---|---|
| 6,103,579 A | * | 8/2000 | Violette | ............ H01L 21/76202 |
| | | | | 257/E21.552 |
| 10,389,359 B1 | * | 8/2019 | Hosaka | ............... H01L 27/0629 |
| 2001/0011753 A1 | * | 8/2001 | Nishida | ................. G11C 11/412 |
| | | | | 257/369 |

(Continued)

FOREIGN PATENT DOCUMENTS

| | | |
|---|---|---|
| JP | 2008103682 A | 5/2008 |
| JP | 4510034 B2 | 7/2010 |

(Continued)

OTHER PUBLICATIONS

International Search Report and Written Opinion for Application No. PCT/US2020/017695. dated Jun. 9, 2020.

*Primary Examiner* — Peter Bradford
(74) *Attorney, Agent, or Firm* — Dorsey & Whitney LLP

(57) ABSTRACT

Apparatuses with a gate electrode in a semiconductor device are described. An example apparatus includes an active region surrounded by an isolation region, and a gate electrode extending in a first direction to pass over the active region. The gate electrode includes a body gate portion over the active region, the body gate portion having a first gate length in a second direction perpendicular to the first direction, a lead-out portion over the isolation region, the lead-out portion having a second gate length in the second direction, the second gate length being greater than the first gate length, and a hammer-head portion having a first end in contact with the body gate portion and a second end opposite to the first end in contact with the hammer-head portion.

12 Claims, 7 Drawing Sheets

(56) References Cited

U.S. PATENT DOCUMENTS

| | | | |
|---|---|---|---|
| 2007/0298524 A1* | 12/2007 | Wu | H01L 22/12 438/14 |
| 2009/0159967 A1* | 6/2009 | Edwards | H01L 29/66659 257/335 |
| 2009/0194823 A1* | 8/2009 | Maeda | H01L 27/088 257/392 |
| 2009/0309162 A1* | 12/2009 | Baumgartner | H01L 29/7856 257/368 |
| 2011/0140278 A1 | 6/2011 | Chen et al. | |
| 2012/0292666 A1* | 11/2012 | Tamaru | H01L 27/1104 257/202 |
| 2013/0256809 A1* | 10/2013 | Liu | H01L 21/28123 257/401 |
| 2016/0284707 A1* | 9/2016 | Okagaki | H01L 23/528 |
| 2018/0090596 A1 | 3/2018 | Chan et al. | |
| 2019/0074297 A1* | 3/2019 | Ishita | H01L 29/0649 |
| 2019/0140096 A1* | 5/2019 | Huang | H01L 29/4238 |
| 2019/0164993 A1* | 5/2019 | Shimbo | H01L 29/78696 |
| 2019/0165186 A1* | 5/2019 | Shimbo | H01L 29/0673 |
| 2019/0172841 A1* | 6/2019 | Ishita | H01L 27/0207 |
| 2020/0176476 A1* | 6/2020 | Hirano | H01L 21/8234 |

FOREIGN PATENT DOCUMENTS

| | | |
|---|---|---|
| KR | 101494808 B1 | 2/2015 |
| WO | 2020167788 A1 | 8/2020 |

\* cited by examiner

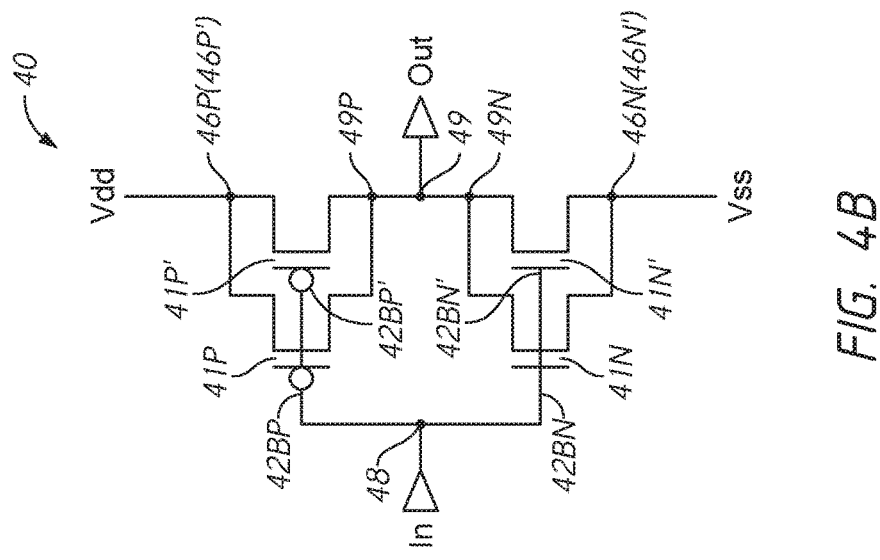
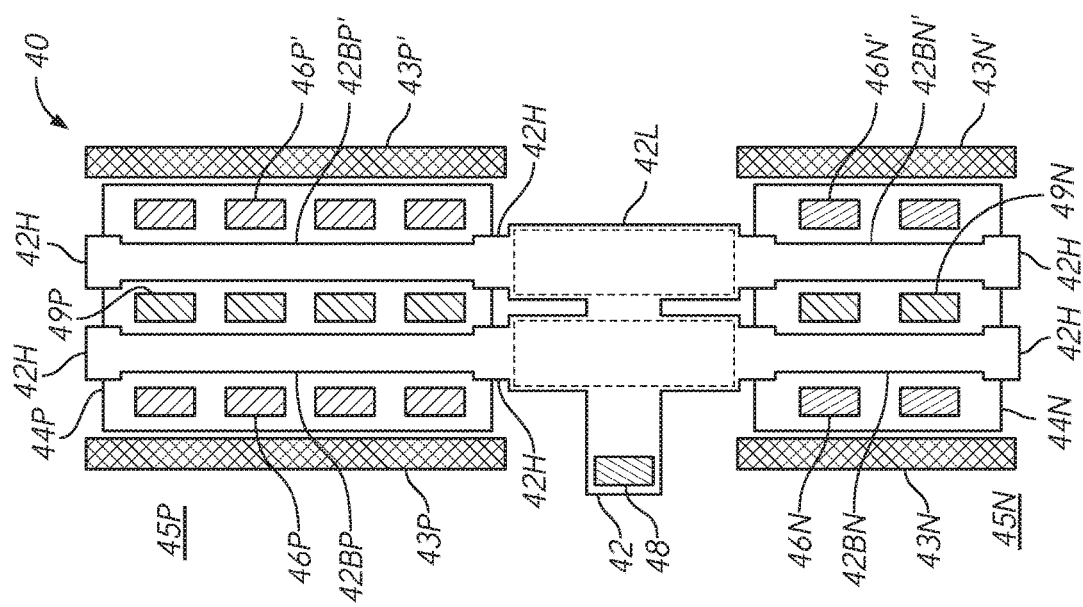
FIG. 4A
FIG. 4B

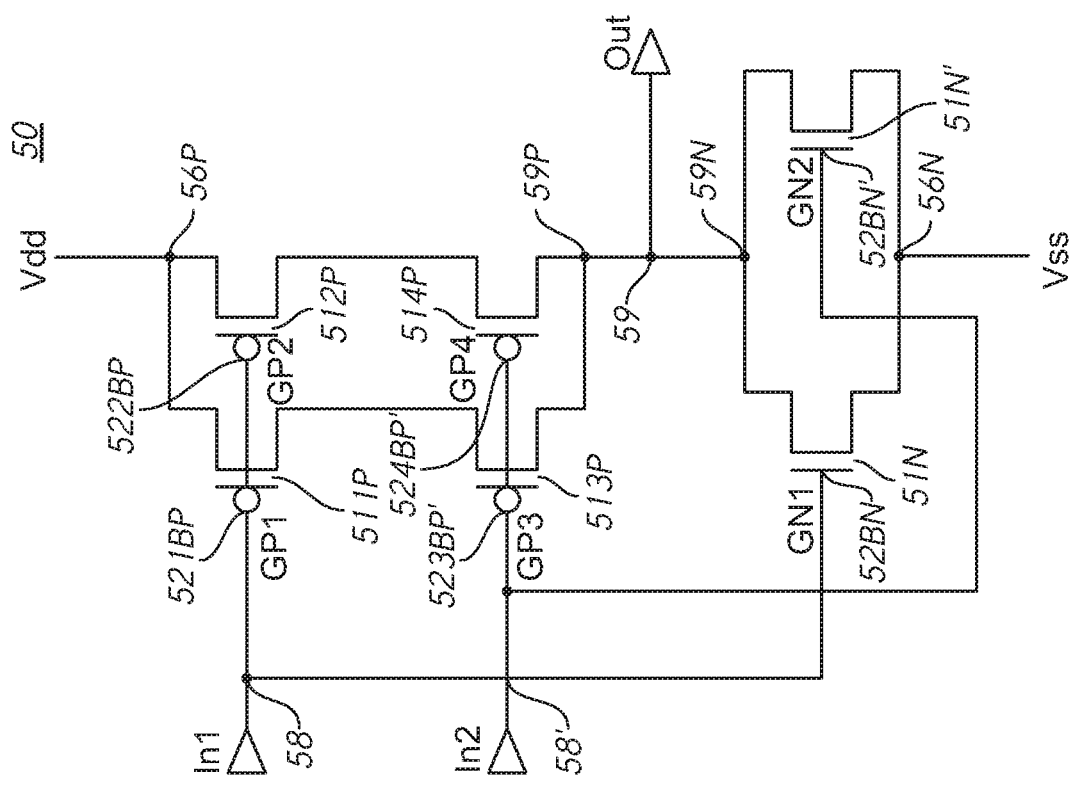
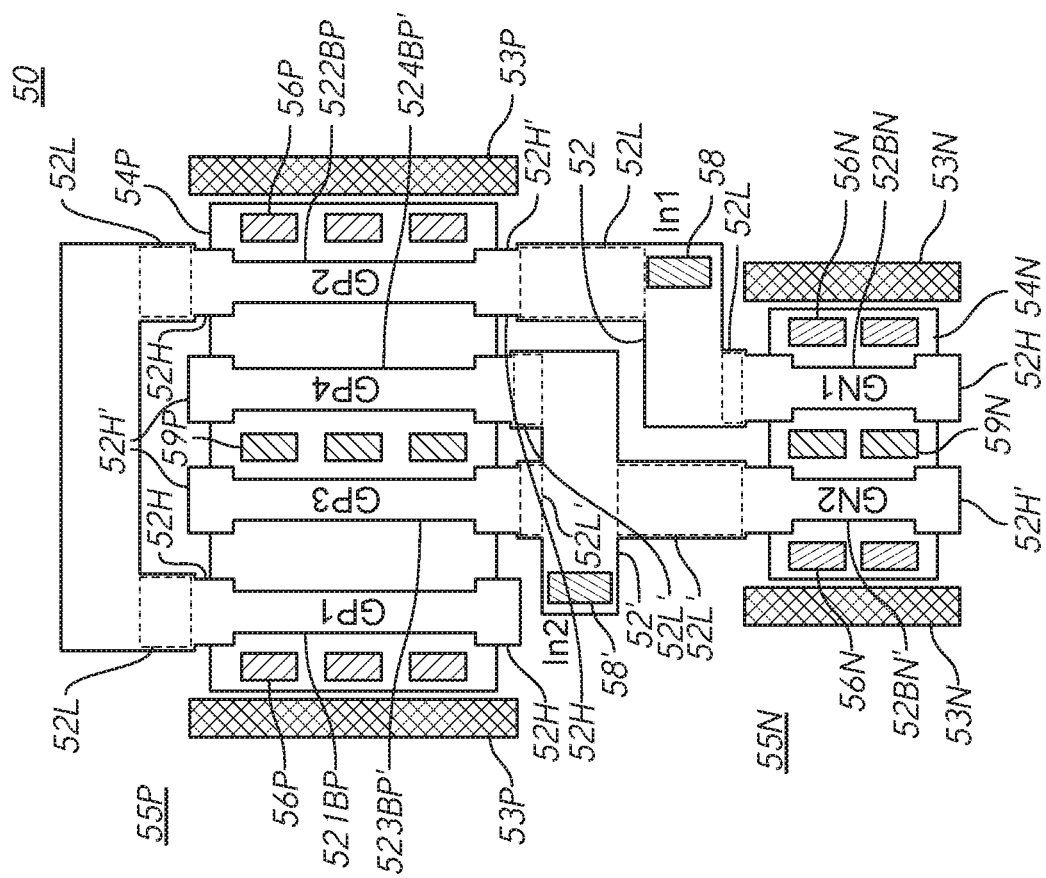
FIG. 5B
FIG. 5A

GATE ELECTRODE LAYOUT WITH EXPANDED PORTIONS OVER ACTIVE AND ISOLATION REGIONS

BACKGROUND

Reduced chip size, high data reliability, reduced power consumption and efficient power usage are features that are demanded from semiconductor memory. In order to reduce chip size, while enhancing current driving capability, a circuit in a conventional semiconductor device includes a plurality of transistors parallel-coupled to each other.

Along with microfabrication of such plurality of transistors, lengths of polysilicon gates electrodes have been reduced. In arranging polysilicon gate electrodes with reduced distance between two adjacent polysilicon gate electrodes may increase relative to the reduced gate lengths and short channel lengths of the polysilicon gate electrodes. The increased relative distance between the adjacent polysilicon gate electrodes may negatively affect microfabrication process, for example, causing undesirable varying sizes of polysilicon gate electrodes.

FIG. 1 is a schematic diagram of a layout for a conventional inverter circuit 10 including a transistor 11. To reduce size variations of polysilicon gate electrode 12, dummy gate electrodes 13 may be included in the layout for the conventional inverter circuit 10. Each of the dummy gate electrodes 13 is positioned over an isolation region 15 (e.g., shallow trench isolation (STI)) surrounding an active region 14 of the transistor 11. The dummy gate electrodes 13 may be simultaneously formed (or patterned) with the gate electrode 12 of the transistor 11 disposed on the active region 14. The active region 14 includes one or more source and/or drain regions. With such configuration, the gate electrode 12 may be formed in a desired pattern.

The gate electrode 12 may include "hammer-head portions" 12H. The hammer-head portions 12H of the gate electrode 12 overlap a border of the active region 14 and the isolation region 15, and have a greater gate length. The hammer-head portions 12H may reduce leakage current of the transistor 11 through the active region 14 around the border (e.g., edges of diffusion layers). However, the greater gate length of the hammer-head portions 12H of the gate electrode 12 may negatively affect the effective performance of the transistor 11.

BRIEF DESCRIPTION OF THE DRAWINGS

FIG. 4A is a schematic diagram of an apparatus including an inverter circuit according to an embodiment of the present disclosure.

FIG. 4B is a circuit diagram of the inverter circuit according to an embodiment of the present disclosure.

FIG. 5A is a schematic diagram of an apparatus including a logic circuit according to an embodiment of the present disclosure.

FIG. 5B is a circuit diagram of the logic circuit according to an embodiment of the present disclosure.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present disclosure may be practiced. These embodiments are described in sufficient detail to enable those skilled in the art to practice the present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
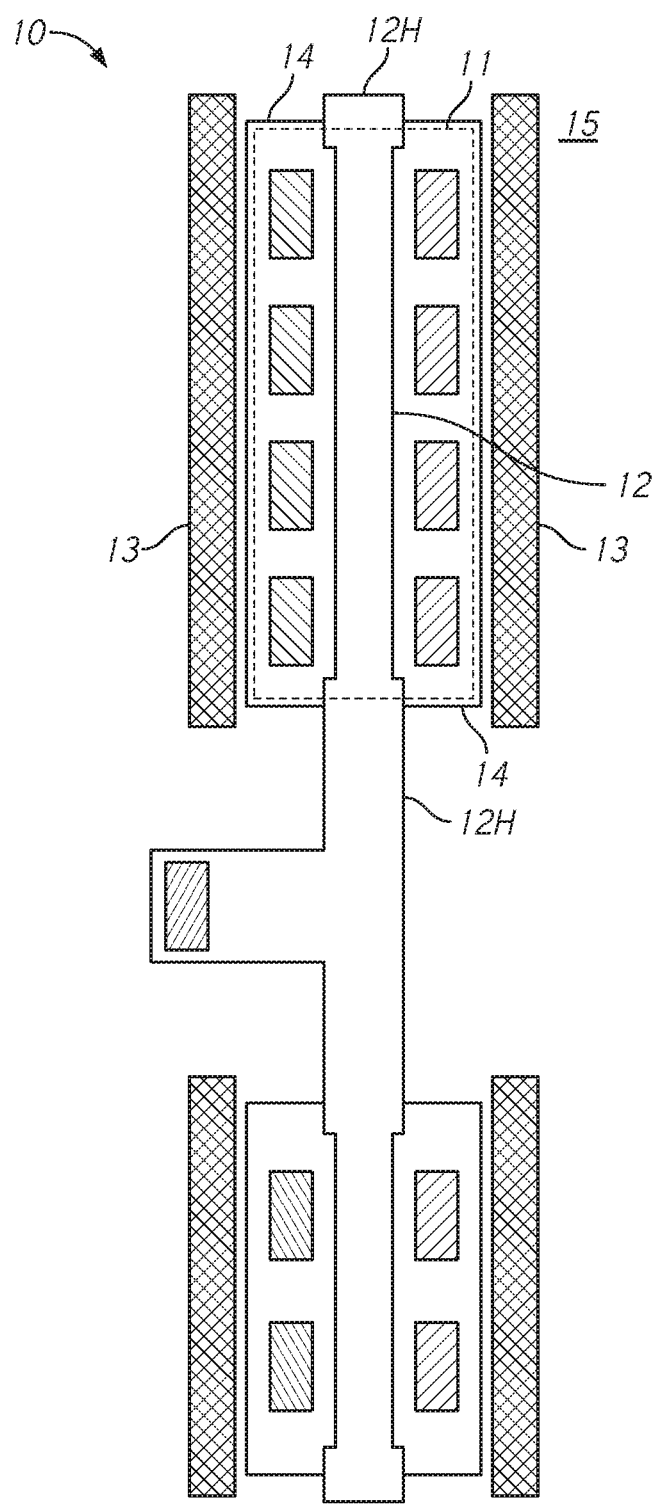
FIG. 1 is a schematic diagram of a layout for a conventional inverter circuit including a transistor.
Figure 2A:
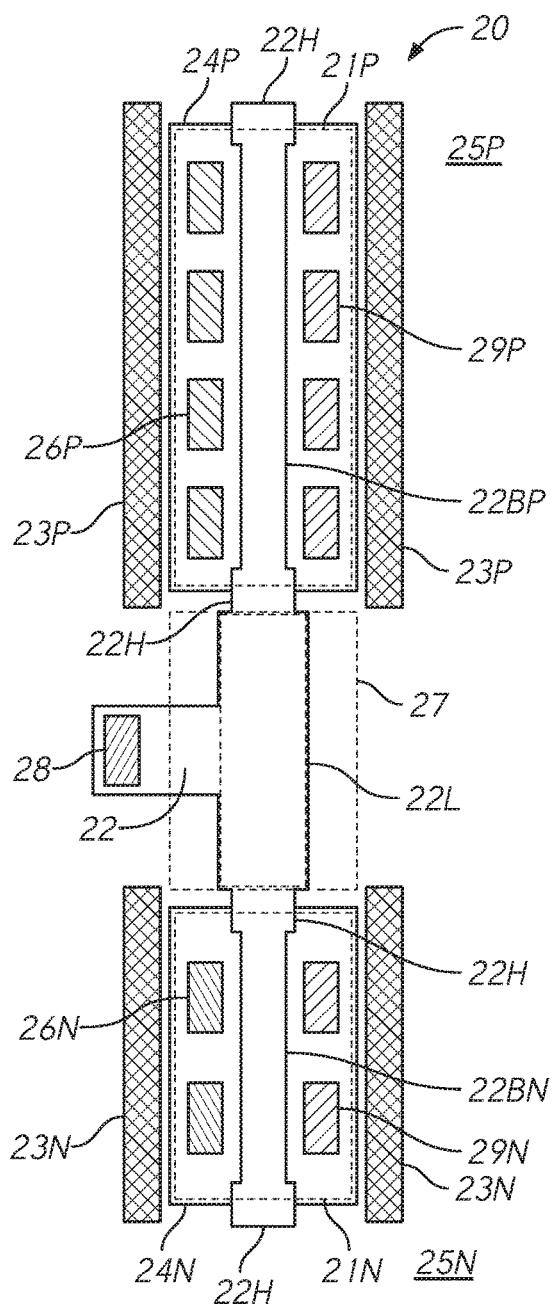
FIG. 2A is a schematic diagram of an apparatus including an inverter circuit according to an embodiment of the present disclosure.
Figure 2B:
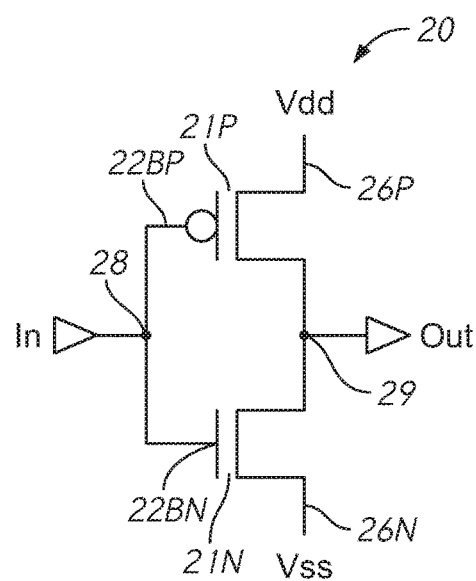
FIG. 2B is a circuit diagram of the inverter circuit according to an embodiment of the present disclosure.

FIG. 2A is a schematic diagram of an apparatus including an inverter circuit 20 according to an embodiment of the present disclosure. FIG. 2B is a circuit diagram of the inverter circuit 20 according to an embodiment of the present disclosure. The inverter circuit 20 may include active regions 24P and 24N, and a gate electrode 22. Each of the active regions 24P and 24N may include diffusion regions (e.g., source region and/or drain region) and a channel region (not shown) between the diffusion regions below the gate electrode 22. Thus the gate electrode 22 may pass over the active regions 24P and 24N. In this example, the inverter circuit 20 may include a transistor 21P of a first type and a transistor 21N of a second type that is of a different polarity from the transistor 21P, and the gate electrode 22 that may receive an input signal for the transistors 21P and 21N. The transistor 21P of the first type may be a p-channel field effect transistor and the transistor 21N of the second type may be an n-channel field effect transistor. The transistor 21P may include diffusion regions (e.g., source region and drain region) in the active region 24P and a body gate portion 22BP of the gate electrode 22. The body gate portion 22BP is disposed over the active region 24P. The transistor 21N may include diffusion regions (e.g., source region and drain region) in the active region 24N and a body gate portion 22BN of the gate electrode 22. The body gate portion 22BN is disposed over the active region 24N. The transistors 21P and 21N may be coupled to an input node In 28 and an output node Out 29. A terminal 26P (typically, a source terminal) may be coupled to a power supply voltage line (e.g., Vdd) and a terminal 26N (typically, a source terminal) of the transistor 21N may be coupled to another power supply voltage line (e.g., Vss) The gate electrode 22 of the transistors 21P and 21N may receive an input signal in from the input node 28. One of the transistors 21P and 21N may provide an output signal to the output node Out 29 through either a terminal 29P (typically, a drain terminal) or a terminal 29N (typically, a drain terminal).

The inverter circuit 20 may further include dummy gate electrodes 23P and 23N. Each of the dummy gate electrodes 23P may be disposed over an isolation region 25P (e.g., shallow trench isolation (STI) surrounding the active region 24P), and may be simultaneously formed (or patterned) with the gate electrode 22. Each of the dummy gate electrodes 23N may be disposed over an isolation region 25N (e.g., shallow trench isolation (STI) surrounding the active region 24N), and may be simultaneously formed with the gate electrode 22. As shown in FIG. 2A, the gate electrode 22 is included across the transistors 21P and 21N in a manner that the dummy gate electrodes 23P may be disposed parallel to a portion of the gate electrode 22 (e.g., in a direction perpendicular to a direction of a gate length for the transistor 21P) and the dummy gate electrodes 23N may be disposed parallel a portion of the gate electrode 22 (in a direction perpendicular to a direction of the gate length for the transistor 21N).

The gate electrode 22 may include hammer-head portions 22H that overlap either borders of the active region 24P and an isolation region 25P or borders of the active region 24N and an isolation region 25N, to cover portions of the borders of the active region 24P and the isolation region 25P or the borders of the active region 24N and the isolation region 25N. The hammer-head portions 22H of the gate electrode 22, having a greater gate length in a gate length direction than body portions 22BP or 22BN of the gate electrode 22 inside the active region 24P or the active region 24N. The gate electrode 22 includes a lead-out portion 22L over either the isolation region 25P or the isolation region 25N The lead-out portion 22L may be disposed outside a region between the dummy gate electrodes 23P and one of the hammer-head portions 22H and outside of a region between the dummy gate electrodes 23N and one of the hammer-head portions 22H. In this example, the lead-out portion 22L may be arranged in contact with two adjacent hammer-head portions 22H of the transistors 21P and 21N. By having the lead-out portion 22L that has a greater gate length than the gate length of the hammer-head portions 22H outside the region between the dummy gate electrodes 23P and 23N, the lead-out portion 22L may reduce undesirable variations (e.g., crack, deformation) in a region 27 lacking the dummy gate electrodes 23P and 23N in manufacturing processes. Because the gate length of the hammer-head portions 22H is less than the gate length of the lead-out portion 22L, the leakage current of the transistors 21P and 21N through the active regions 24P and 24N around the borders (e.g., edges of diffusion layers) due to the hammer-head portions 22H may be alleviated and may not significantly affect performance of the transistors 21P and 21N.

Figure 3A:
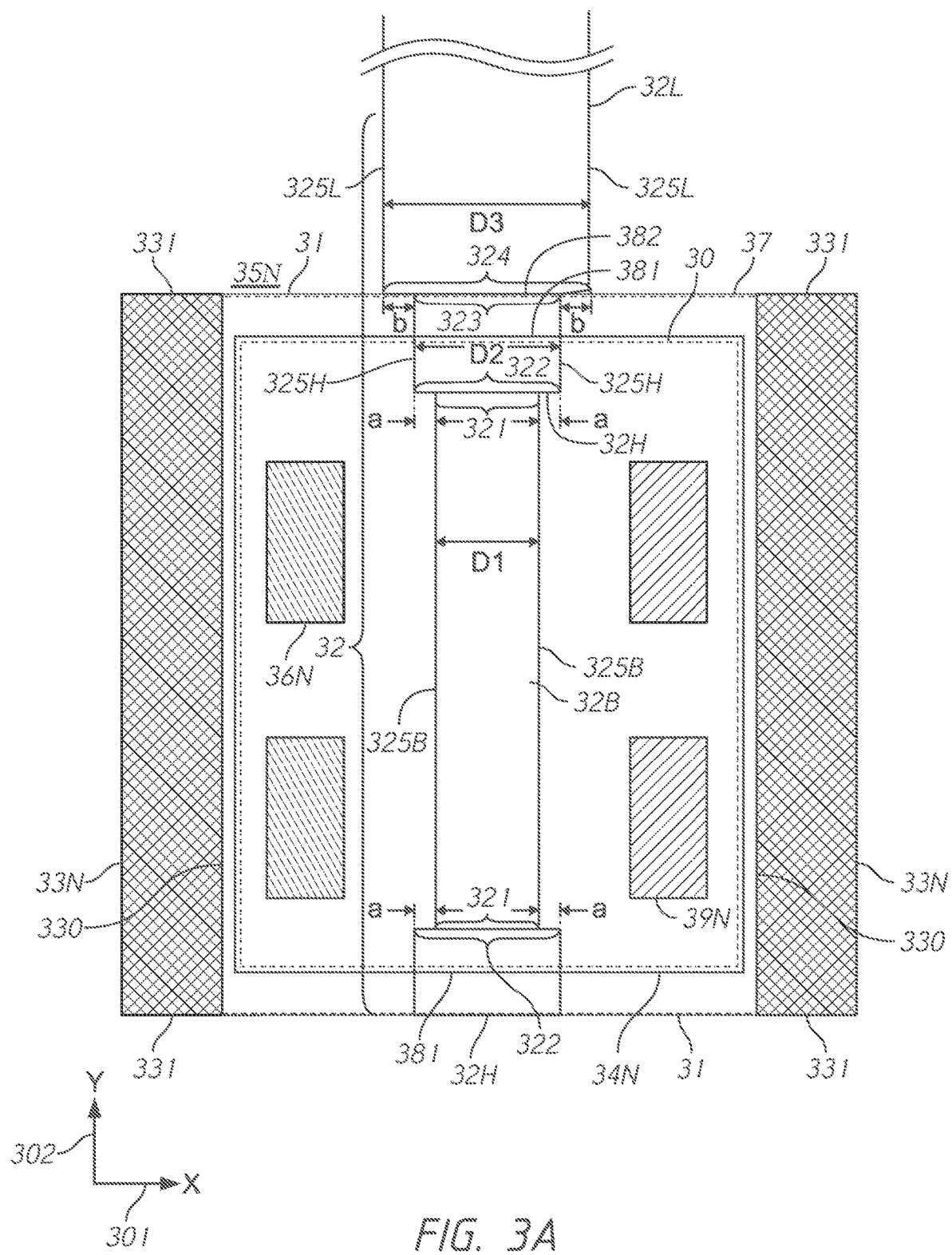
FIG. 3A is a schematic diagram of an apparatus including a transistor according to an embodiment of the present disclosure.

FIG. 3A is a schematic diagram of an apparatus including a transistor 30 according to an embodiment of the present disclosure. The apparatus is a device, including the transistor 30 that is an n-channel field effect transistor that may be used as the transistor 21N in the inverter circuit 20 in FIGS. 2A and 2B. The apparatus may include an active region 34N and a gate electrode 32, The active regions 34N may include diffusion regions (e.g., source region and drain region) and a channel region (not shown) between the diffusion regions below the gate electrode 32. The transistor 30 on the active region 34N may include a terminal 36N that is one terminal of a source terminal and a drain terminal coupled to a power supply voltage line (e.g., Vss), a gate electrode 32 disposed on (e.g., passing over) the active region 34N and coupled to an input node (e.g., the input node In 28 of FIG. 2B) that may receive an input signal, and a terminal 39N that is the other terminal of the source and drain terminals on the active region 34N coupled to an output node (e.g., the output node Out 29 of FIG. 2B) that may provide an output signal. Thus, the transistor 30 may receive the input signal via the gate electrode 32 and provide the output signal via the terminal 39N. The transistor 30 may also include dummy gate electrodes 33N. Each of the dummy gate electrodes 33N may be formed (or patterned) over a shallow trench isolation (STI) 35N (e.g., edges of diffusion layers) surrounding the active region 34N simultaneously with the gate electrode 32, in a manner that the dummy gate electrodes 33N may be aligned adjacent to the active region 34N, extending in a Y direction 302 that is perpendicular to an X direction 301 (e.g., a gate length direction) on a plane defined by the active region 34N.

The gate electrode 32 extending in parallel to the dummy gate electrodes 33N may include a body gate portion 32B, hammer-head portions 32H, and a lead-out portion 32L. The body gate portion 32B, each of the hammer-head portions 32H, and the lead-out portion 32L may be a first portion, a second portion and a third portion, respectively. The hammer-head portions 32H overlaps respective portions of a border 381 of the active region 34N and the surrounding STI 35N, the respective portions of the border 381 defining respective edges of the channel region. The body gate portion 32B over the active region 34N may be between the hammer-head portions 32H. As shown in FIG. 3A, the body gate portion 32B may have sides 325B along the Y direction. Each of the hammer-head portions 32H has sides 325H along the Y direction. Thus, the dummy electrodes 33N, the sides 325B and the sides 325H may be aligned parallel to the Y direction 302. For example, a length (e.g., a distance) "a" in the X direction 301 between the side 325B of the body gate portion 32B near the terminal 36N and the side 325H of the hammer-head portion 32H near the terminal 36N may be in an order of 5 nm (e.g., a≈1-10 nm). Thus, the hammer-head portions 32H of the gate electrode 32 may have a gate length (e.g., dimension) D2 between the sides 325H that is longer by 2a than a gate length D1 of the body gate portion 32B, between the sides 325B of the body gate portion 32B (D2=D1±2a) in the X direction 301. Each of the hammer-head portions 32H has an end 322 that is in contact with an end 321 of the body gate portion 32b. Since the hammer-head portions 32H may cover portions of the border between the active region 34N and the surrounding STI 35N, the body gate portion 32B may be isolated from the border 381 of the active region 34N and the surrounding STI 35N.

The lead-out portion 32L over the STI 35N may have an end 324 that is in contact with an end 323 of one of the hammer-head portions 32H opposite to the end 322 of the one of the hammer-head portions 32H. The lead-out portion 32L may also have sides 325L along the Y direction. Thus, the sides 325L and the sides 325H may be aligned parallel to the Y direction 302. As shown in FIG. 3A, a length (e.g., a distance) "b" in the X direction 301 between the side 325H of the hammer-head portion 32H and the side 325L of the lead-out portion 32L near the terminal 36N may be in an order of 5 nm (e.g., b≈1-10 nm). The length "b" may be the same length as the length "a," or different from the length "a," The lead-out portion 32L of the gate electrode 32 may have a gate length (e.g., dimension) D3 in the X direction 301 that is greater by 2b than the gate length D2 of the hammer-head portion 32H in the X direction 301 (e.g. D3=D2+2b). Thus, the lead-out portion 32L has a greater gate length D3 than the gate length D2 of the hammer-head portions 32H. As a result, the lead-out portion 32L may reduce undesirable variations (e.g., crack, deformation) in manufacturing processes while reducing the leakage current of the transistor 30 through the active region 34N around the border by the hammer-head portions 32H.

Another border 382 between the lead-out portion 32L and the hammer-head portion 32H may be proximate to each side 31, and the end 324 of the lead-out portion 32L and the end 323 of the one of the hammer-head portions 32H may be in contact with each other at the other border 382. The sides 31 may be line segments extended from ends (e.g., end terminations) 331 of the dummy gate electrodes 33N over the STI 35N to connect the ends 331 as shown in FIG. 3A. In some embodiments, as shown in FIG. 3A, the other border 382 between the lead-out portion 32L and the hammer-head portion 32H may be on the line (e.g., one of the sides 31) from the end 331 of the dummy gate electrode 33N. A region 37 may be defined by sides 330 of the dummy gate electrodes 33N along the Y direction 302 and facing the active region 34N and the sides 31 along the X direction 301. In some embodiments of the disclosure, the lead-out portion 32L may be disposed outside of the region 37. As a result, the border 382 is outside of the region 37. Alternatively, in some embodiments of the disclosure, at least a portion of the lead-out portion 32L may be disposed within the region 37. As a result, a distance between the other border 382 and the border 381 is less than a distance between the line (e.g., one of the sides 31) and the border 381.

Although above example is explained in a context of an n-channel field effect transistor, it should be further noted that a lead-out portion of a gate electrode can be similarly applied to any transistor, including a p-channel field effect transistor, such as the transistor 21P in the inverter circuit 20 of FIG. 2.

Figure 3B:
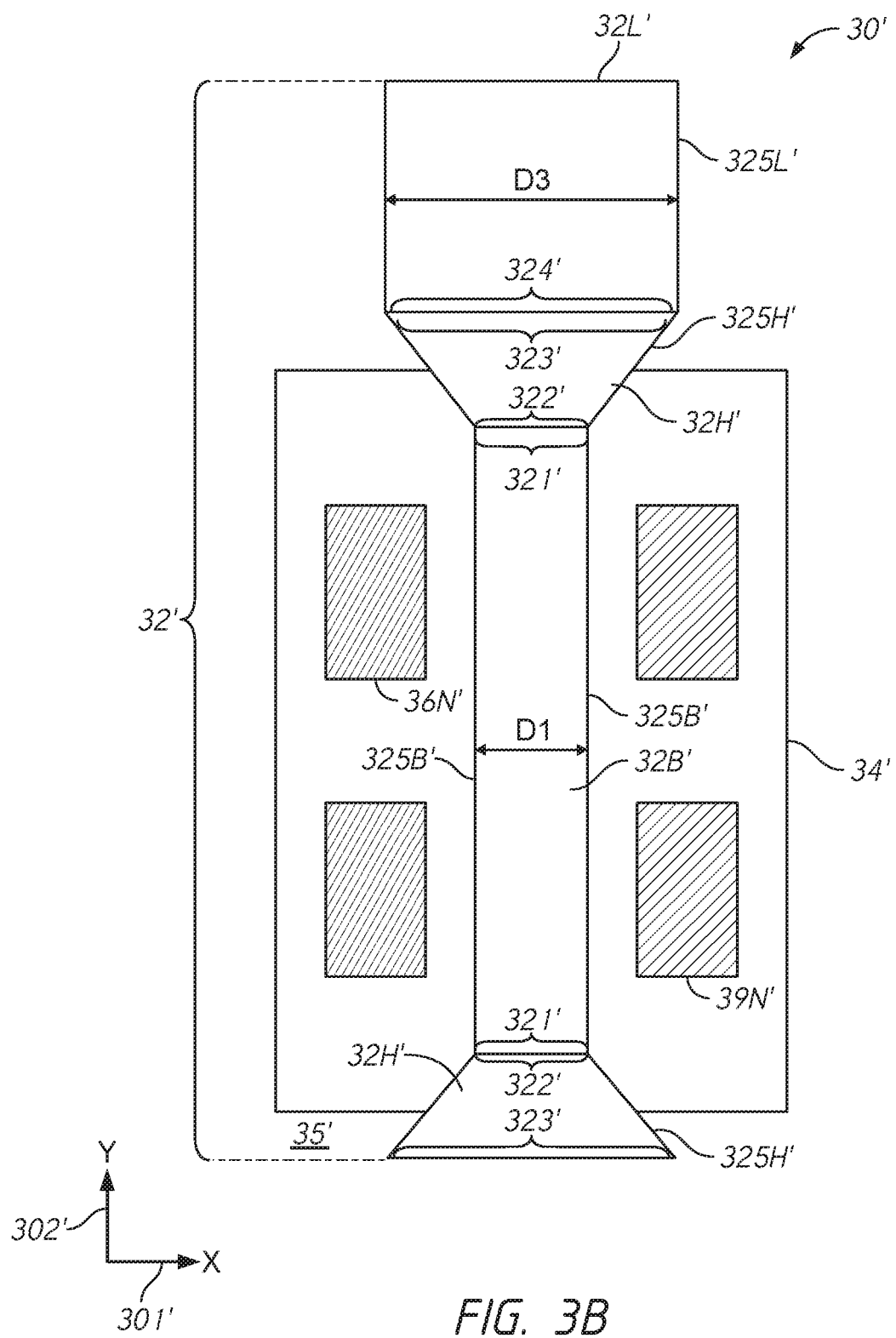
FIG. 3B is a schematic diagram of an apparatus including a transistor according to an embodiment of the present disclosure.

FIG. 3B is a schematic diagram of an apparatus including a transistor 30' according to an embodiment of the present disclosure. The transistor 30' is an n-channel field effect transistor that may be used as the transistor 21N in the inverter circuit 20 in FIGS. 2A and 2B. The transistor 30' on an active region 34' may include a terminal 36N' that is one of a source terminal and a drain terminal coupled to a power supply voltage line (e.g., Vss), a gate electrode 32' disposed over the active region 34' and coupled to an input node (e.g., the input node In 28 of FIG. 2B) that may receive an input signal, and a terminal 39N' that is the other terminal, such as the drain terminal or the source terminal, on the active region 34' coupled to an output node (e.g., the output node Out 29 of FIG. 2B) that may provide an output signal. Thus, the transistor 30' may receive the input signal via the gate electrode 32' and provide the output signal via the terminal 39N'.

The gate electrode 32' may include a body gate portion 32B', hammer-head portions 32H', and a lead-out portion 32L'. The hammer-head portions 32H' may overlap respective portions of a border of the active region 34' and surrounding STI (e.g., edges of diffusion layers), the respective portions of the border defining respective edges of the channel region. The body gate portion 32B' may be over the active region 34' and between the hammer-head portions 32H'. As shown in FIG. 3B, the body gate portion 32B may have sides 325B' along a Y direction 302' that is perpendicular to an X direction 301' (e.g., a gate length direction) on a plane defined by the active region 34'. Each of the hammer-head portions 32H' has an end 322' that is in contact with an end 321' of the body gate portion 32B'. Thus, the body gate portion 32B' may be isolated from the border of the active region 34' and a shallow trench isolation (STI) (e.g., the isolation region 25N of FIG. 2A) surrounding the active region 34'. The lead-out portion 32L' may have an end 324' that is in contact with an end 323' of one of the hammer-head portions 32H opposite to the end 322' of the one of the hammer-head portions 32H. The lead-out portion 32L' may also have sides 325L' along the Y direction 302'. Thus, the sides 325L' and the sides 325B' may be aligned parallel to the Y direction 302'. As shown in FIG. 3B, a gate length "D3" of the lead-out portion 32L' in the X direction 301' is greater than a gate length "D1" of the body gate portion 32B'. In the example of FIG. 3B, the hammer-head portions 32H' may be formed in a cone shape, where the sides 325H' may be straight line segments when viewed from a direction perpendicular to the active region 34', and connect the sides 325B' and the sides 325L'. However, the sides 325H' can be in any shape (e.g., arcs, etc.), when viewed from the direction perpendicular to the active region 34', to connect the sides 325B' and the sides 325L'. Thus, the lead-out portion 32L, having the greater gate length D3 than the gate length D1 of body gate portion 32B, may reduce undesirable variations (e.g., crack, deformation) in manufacturing processes while reducing the leakage current of the transistor 30' through the active region 34' around the border by the hammer-head portions 32H'.

FIG. 4A is a schematic diagram of an apparatus including an inverter circuit 40 according to an embodiment of the present disclosure. FIG. 4B is a circuit diagram of the inverter circuit 40 according to an embodiment of the present disclosure. The inverter circuit 40 may include active regions 44P and 44N, and a gate electrode 42. Each of the active regions 44P and 44N may include diffusion regions (e.g., source region and/or drain region) and a channel region below the gate electrode 42. Thus the gate electrode 42 may be disposed over (e.g., pass over) the active regions 44P and 44N. In this example, the inverter circuit 40 may include a plurality of transistors 41P and 41P' of a first type and a plurality of transistors 41N and 41N' of a second type that is of a different polarity from the plurality of transistors 41P and 41P'. Here, a number of transistors in each plurality of transistors is two; however the number of transistors is not limited to two. The plurality of transistors 41P and 41P' of the first type may be p-channel field effect transistors and the plurality of transistors 41N and 41N' of the second type may be n-channel field effect transistors. Each of the plurality of transistors 41P and 41P' may include diffusion regions (e.g., source region and drain region) in the active region 44P. Each of the plurality of transistors 41N and 41N' may include diffusion regions in the active region 44N. The plurality of transistors 41P and 41P' have terminals 46P and 46P' respectively, coupled to a power supply voltage line providing a power supply voltage (e.g., Vdd). The plurality of transistors 41P and 41P' may share a terminal 49P coupled to an output node Out 49. Thus, the plurality of transistors 41P and 41P' are parallel-coupled to each other between the power supply voltage line and the output node Out 49. The plurality of transistors 41N and 41N' have terminals 46N and 46N' respectively, coupled to another power supply voltage line providing another power supply voltage (e.g., Vss) different from the power supply voltage (e.g., Vdd). The plurality of transistors 41N and 41N' may share a terminal 49N coupled to the output node Out 49. Thus, the plurality of transistors 41N and 41N' are parallel-coupled to each other between the other power supply voltage line and the output node Out 49. The plurality of transistors 41P and 41P' of the first type and the plurality of transistors 41N and 41N' of the second type may be parallel-coupled to each other among an input node In 48, the output node Out 49, the power supply voltage line (e.g., Vdd) and the other power supply voltage line (e.g., Vss). Thus the terminals 46P and 46P' of the plurality of transistors 41P and 41P' on the active region 44P may be coupled to the power supply voltage line, and the terminals 46N and 46N' of the plurality of transistors 41N and 41N' on the active region 44N may be coupled to the other power supply voltage line. The common gate electrode 42 of the transistors 41P, 41P' 41N and 41N' may receive an input signal from the input node In 48. One of the diffusion regions (e.g., drain regions) in the active region 44P of the plurality of transistors 41P and 41P' and the active region 44N of the plurality of transistors 41N and 41N' may provide an output signal to the output node Out 49 from either the terminal 49P on the active region 44P or the terminal 49N on the active region 44N.

The gate electrode 42 may include body gate portions 42BP, 42BP', 42BN and 42BN'. As shown in FIG. 4A, the plurality of transistors 41P and 41P' may include the body gate portions 42BP and 42BP' respectively over the active region 44P. The plurality of transistors 41P and 41P' may receive the input signal from the input node In 48 at the body gate portions 42BP and 42BP'. Similarly, the plurality of transistors 41N and 41N' may include body gate portions 42BN and 42BN' respectively over the active region 44N to receive the input signal from the input node In 48. The gate electrode 42 may include hammer-head portions 42H. The hammer-head portions 42H in contact with the body gate portion 42BP and the hammer-head portions 42H in contact with the body gate portion 42BP' may be disposed to overlap a border of the active region 44P and an isolation region 45P (e.g., shallow trench isolation (STI) surrounding the active region 44P), Similarly, the hammer-head portions 42H in contact with the body gate portion 42BN and the hammer-head portions 42H in contact with the body gate portion 42BN' may be disposed to overlap a border of the active region 44N and an isolation region 45N (e.g., shallow trench isolation (STI) surrounding the active region 44N). Each of hammer-head portions 42H may have a greater length in a gate length direction than a gate length of each of the body gate portions 42BP, 42BP', 42BN, 42BN' in the gate length direction. The gate electrode 42 includes lead-out portions 42L. In this example, one of the lead-out portions 42L may be arranged in contact with the hammer-head portions 42H of the transistors 41P and 41N and the other of the lead-out portions 42L may be arranged in contact with the hammer-head portions 42H of the transistors 41P' and 41N'. Each of the lead-out portions 42L may have a greater gate length in the gate length direction than the gate length of the adjacent hammer-head portion 42H in contact with the lead-out portion 42L. Because the gate length of each hammer-head portion 42H is less than the gate length of the adjacent lead-out portion 42L, the leakage current of the transistors 41P and 41P' through the active region 44P and the leakage current of the plurality of transistors 41N and 41N' through the active region 44N around the borders (e.g., edges of diffusion layers) due to the hammer-head portions 42H may be alleviated and may not significantly affect performance of the transistors 41P, 41P', 41N and 41N'.

The inverter circuit 40 may further include dummy gate electrodes 43P, 43P', 43N and 43N'. The dummy gate electrodes 43P and 43P' may be formed (or patterned) over the isolation region 45P simultaneously with the gate electrode 42. The dummy gate electrodes 43N and 43N' may be formed (or patterned) over the isolation region 45N simultaneously with the gate electrode 42. As shown in FIG. 4A, the dummy gate electrodes 43P and 43P' may be disposed parallel to the body gate portions 42BP and 42BP' of the gate electrode 42 over the active region 44P (e.g., in a direction perpendicular to a direction of a gate length). Similarly, the dummy gate electrodes 43N and 43N' may be disposed parallel to the body gate portions 42BN and 42BN' of the gate electrode 42 over the active region 44N. The lead-out portions 42L may be arranged to be outside a region between the dummy gate electrodes 43P and 43P' and the hammer-head portions 42H on the border of the active region 44P and the isolation region 45P, as well as outside of a region between the dummy gate electrodes 43N and 43N' and the hammer-head portions 42H that overlaps the border of the active region 44N and the isolation region 45N. By having the lead-out portions 42L that has a greater length than the length of the hammer-head portions 42H between the active regions 44P and 44N, and outside a region between the dummy gate electrodes 43P and 43P' as well as outside a region between the dummy gate electrodes 43N and 43N' (e.g., not surrounded by the dummy gate electrodes 43P, 43P', 43N, 43N'), the lead-out portion 42L may reduce undesirable variations (e.g., crack, deformation) in a region lacking the dummy gate electrodes 43P, 43P', 43N and 43N' in manufacturing processes.

FIG. 5A is a schematic diagram of an apparatus including a logic circuit 50 according to an embodiment of the present disclosure. FIG. 5B is a circuit diagram of the logic circuit 50 according to an embodiment of the present disclosure. In this example, the logic circuit 50 may be a two-input NOR gate circuit providing a result of a negation of a logical sum of two input signals. The logic circuit 50 may include a plurality of transistors 511P and 512P of a first type that may receive an input signal In1, a plurality of transistors 513P and 514P of the first type that may receive an input signal In2, and a plurality of transistors 51N and 51N' of a second type that is of a different polarity from the plurality of transistors 511P, 512P, 513P and 514P of the first type. The plurality of transistors 511P, 512P, 513P and 514P of the first type may be p-channel field effect transistors and the plurality of transistors 51N and 51N' of the second type may be n-channel field effect transistors.

The logic circuit 50 may include active regions 54P and 54N, and gate electrodes 52 and 52'. Each of the active regions 54P and 54N may include diffusion regions (e.g., source region and drain region) and channel regions (not shown) between the diffusion regions and below the gate electrodes 52. and 52'. Thus each of the gate electrodes 52 and 52' may pass over the active regions 54P and 54N. Each of the plurality of transistors 511P, 512P, 513P and 514P may include diffusion regions (e.g., source and drain regions) in the active region 54P. Each of the plurality of transistors 51N and 51N' may include diffusion regions (e.g., source and drain regions) in the active region 54N. As shown in FIG. 5A, the gate electrodes 52 and 52' may be disposed over the active regions 54P and 54N. The gate electrode 52 may include body gate portions 521BP, 522BP and 52BN and an input node 58, and may receive the input signal In1 at the input node 58. The plurality of transistors 511P and 512P may include the body gate portions 521BP and 522BP respectively over the active region 54P, and may receive the input signal In1 at the body gate portions 521BP and 522BP respectively. The transistor 51N may include the body gate portion 52BN over the active region 54N to receive the input signal In1. The gate electrode 52' may include body gate portions 52313P', 524BP' and 52BN' and an input node 58', and may receive the input signal In2 at the input node 58'. The plurality of transistors 513P and 514P may include the body gate portions 523BP' and 524BP' respectively over the active region 54P, and may receive the input signal In2 at the body gate portions 523BP' and 524BP' respectively. The transistor 51N' may include the body gate portion 52BN' over the active region 54N to receive the input signal In2.

The plurality of transistors 511P, 512P may share (e.g., commonly include) a terminal 56P included in the active region 54P and coupled to a power supply voltage line providing a power supply voltage (e.g., Vdd). The plurality of transistors 511P, 512P may also be coupled to the plurality of transistors 513P, 514P, respectively. The plurality of transistors 513P, 514P may share (e.g., commonly include) a terminal 59P in the active region 54P, and coupled to an output node Out 59 that may provide an output signal. A combination of the transistors 511P and 513P may be coupled in series between the terminals 56P and 59P as well as a combination of the transistors 512P and 514P may be coupled in series between the terminals 56P and 59P. In the other words, the serially-coupled the transistors 511P and 513P and the serially-coupled the transistors 512P and 514P are parallel-coupled to each other between the power supply voltage line and the output node Out 59. The plurality of transistors 51N and 51N' may share (e.g., commonly include) a terminal 56N in the active region 54N coupled to another power supply voltage line providing another power supply voltage (e.g., Vss) different from the power supply voltage (e.g., Vdd). The plurality of transistors 51N and 51N' may also share (e.g., commonly include) a terminal 59N in the active region 54N, coupled to the output node Out 59. Thus, the plurality of transistors 51N and 51N' are parallel-coupled to each other between the other power supply voltage line and the output node Out 59. One of the diffusion regions (e.g., drain regions) in the active region 54P of the plurality of transistors 511P, 512P, 513P and 514P and the active region 54N of the plurality of transistors 51N and 51N' may provide an output signal to the output node Out 59 from either the terminal 59P on the active region 54P or the terminal 59N on the active region 54N.

If either the input signal In1 or the input signal In2 is at a logic high level (e.g., "1"), either the transistor 51N or the transistor 51N', responsive to the input signal In1 or the input signal In2, may couple the terminal 56N to the terminal 59N, thus the power supply voltage line providing zero or negative voltage (e.g., Vss) may be coupled to the output node Out 59 to provide the output signal at a logic low level (e.g., "0"). Simultaneously, responsive to the input signal fill or the input signal In2 at the logic high level, either the plurality of transistors 511P and 512P or the plurality of transistors 513P and 514P may be deactivated and decouple the terminal 56P from the terminal 59P, thus the power supply voltage line providing a positive voltage (e.g., Vdd) is decoupled from the output node Out 59. Thus, responsive to either the input signal In1 or the input signal In2 being at the logic high level, the output node Out 59 may provide the output signal at the logic low level. If both input signals In1 and In2 are at the logic low level, the transistors 51N and 51N' may not be activated and may decouple the terminal 56N from the terminal 59N, thus the zero or negative voltage (e.g., Vss) may not be provided to the output node Out 59. At the same time, because the input signals In1 and In2 are at the logic low level, the plurality of transistors 511P and 512P and the plurality of transistors 513P and 514P may be activated and couple the terminal 56P to the terminal 59P, thus the power supply voltage line providing a positive voltage (e.g., Vdd) is coupled to the output node Out 59. Thus, responsive to both the input signals In1 and In2 being at the logic high level, the output node Out 59 may provide the output signal at the logic high level.

The gate electrode 52 may include hammer-head portions 52H and the gate electrode 52' may include hammer-head portions 52H'. The hammer-head portions 52H and 52H' in contact with any of the body gate portions 521BP, 522BP, 523BP', 524BP' may be disposed to overlap a border of the active region 54P and an isolation region 55P (e.g., shallow trench isolation (STI) surrounding the active region 54P). Similarly, the hammer-head portions 52H and 52H' in contact with any of the body gate portions 52BN, 52BN' may be disposed to overlap a border of the active region 54N and an isolation region 55N (e.g., shallow trench isolation (STI) surrounding the active region 54N). Each of hammer-head portions 52H and 52H' may have a greater length in a gate length direction than a gate length of each of the body gate portions 521BP, 522BP, 523BP', 524BP', 52BN, 52BN' in the gate length direction. The gate electrode 52 includes lead-out portions 52L and the gate electrode 52' includes lead-out portions 52L'. In FIG. 5A, for example, one of the lead-out portions 52L may be arranged in contact with the hammer-head portions 52H of the transistors 511P. Some of the lead-out portions 52L may be arranged in contact with the hammer-head portions 52H of the transistor 512P. Another one of the lead-out portions 52L may be coupled the transistor 51N. One of the lead-out portions 52L' may be arranged in contact with the hammer-head portions 52H' of the transistors 513P and 51N'. The other lead-out portion 52L' may be arranged in contact with the hammer-head portions 52H' of the transistor 514P. Each of the lead-out portions 52L and 52L' may have a greater gate length in the gate length direction than the gate length of the adjacent hammer-head portion 52H and 52H'. Because the gate length of each hammer-head portion 52H or 52H' is less than the gate length of the adjacent lead-out portion 52L or 52L', the leakage currents of the transistors 511P, 512P, 513P, 514P, 51N, 51N' through the active regions 54P and 54N due to the hammer-head portions 52H and 52H' may be alleviated and may not significantly affect performance of the transistors 511P, 512P, 513P, 514P, 51N, 51N'.

The logic circuit 50 may further include dummy gate electrodes 53P and 53N. The dummy gate electrodes 53P may be formed (or patterned) over the isolation region 55P simultaneously with the gate electrodes 52 and 52'. The dummy gate electrodes 53N may be formed (or patterned) over the isolation region 55N simultaneously with the gate electrodes 52 and 52'. As shown in FIG. 5A, the dummy gate electrodes 53P may be disposed parallel to the body gate portions 521BP, 522BP, 523BP' and 524BP' of the gate electrodes 52 and 52' over the active region 54P (e.g., in a direction perpendicular to a direction of a gate length). Similarly, the dummy gate electrodes 53N' may be disposed parallel to the body gate portions 52BN and 52BN' of the gate electrodes 52 and 52' over the active region 54N. The lead-out portions 52L and 52L' may be arranged to be outside a region between the dummy gate electrodes 53P and the hammer-head portions 52H and 52H' on the border of the active region 54P and the isolation region 55P, as well as outside of a region between the dummy gate electrodes 53N and the hammer-head portions 52H and 52H' on the border of the active region 54N and the isolation region 55N. By having the lead-out portions 52L and 52L' that have greater gate lengths than the gate lengths of the hammer-head portions 52H and 52H', outside a region between the dummy gate electrodes 53P as well as outside a region between the dummy gate electrodes 53N (e.g., not surrounded by the dummy gate electrodes 53P, 53N), the lead-out portions 52L and 52L' may reduce undesirable variations (e.g., crack, deformation) in a region lacking the dummy gate electrodes 53P and 53N around in manufacturing processes.

Figures 6A, 6B:
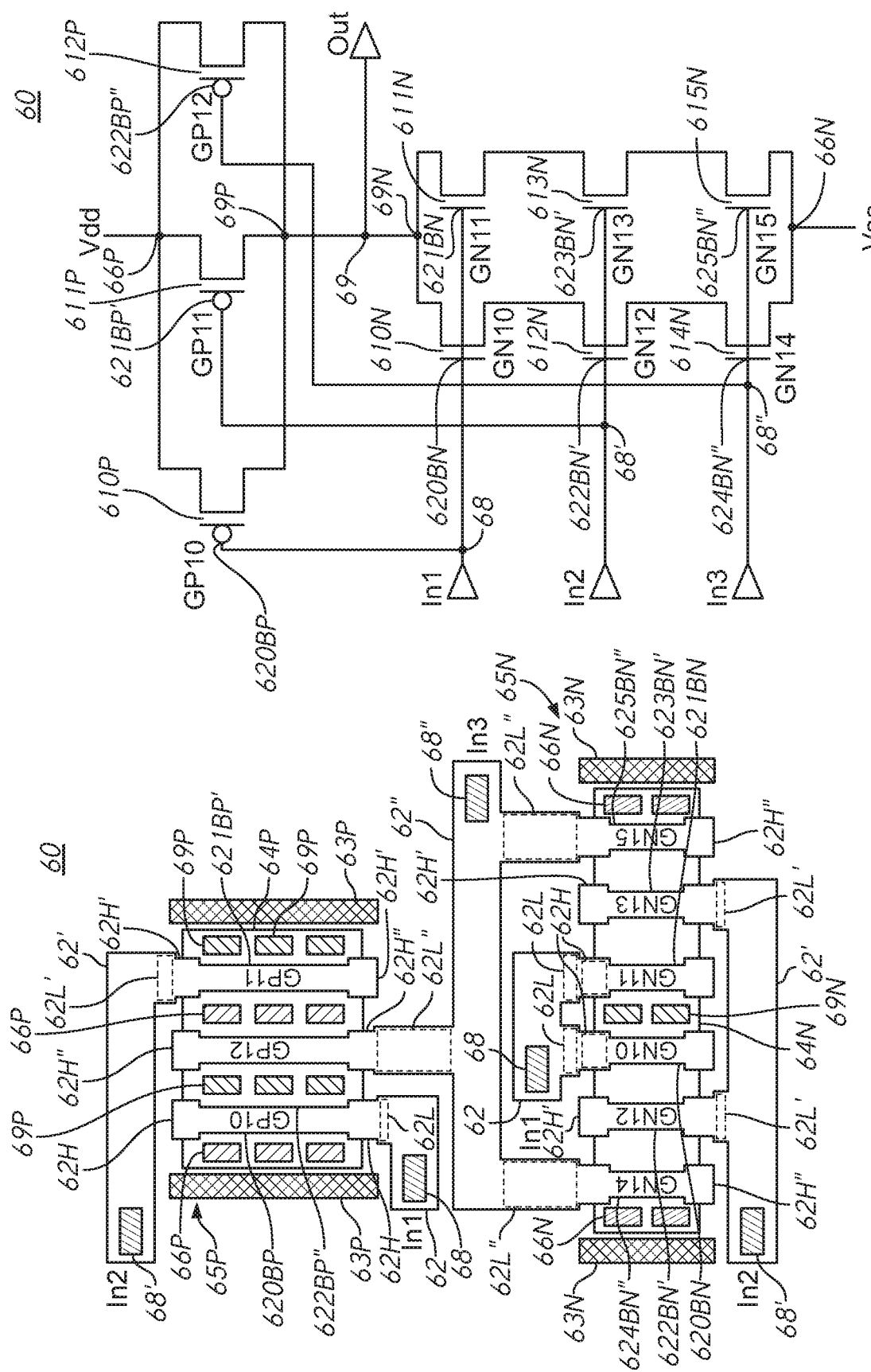
FIG. 6A is a schematic diagram of an apparatus including a logic circuit according to an embodiment of the present disclosure.
FIG. 6B is a circuit diagram of the logic circuit according to an embodiment of the present disclosure.

FIG. 6A is a schematic diagram of an apparatus including a logic circuit 60 according to an embodiment of the present disclosure. FIG. 6B is a circuit diagram of the logic circuit 60 according to an embodiment of the present disclosure. In this example, the logic circuit 60 may be a three-input NAND gate circuit providing a result of a negation of a logical product of three input signals. The logic circuit 60 may include a plurality of transistors 610P, 611P and 612P of a first type that may receive input signals In1, In2 and In3 respectively. The logic circuit 60 may further include a plurality of transistors 610N and 611N that may receive the input signal In1, a plurality of transistors 612N and 613N that may receive the input signal In2, a plurality of transistors 614N and 615N that may receive the input signal In3. The plurality of transistors 610N, 611N, 612N, 613N, 614N and 615N may be transistors of a second type that is of a different polarity from the plurality of transistors 610P, 611P and 612P of the first type. The plurality of transistors 610P, 611P and 612P of the first type may be p-channel field effect transistors and the plurality of transistors 610N, 611N, 612N, 613N, 614N and 615N of the second type may he n-channel field effect transistors.

The logic circuit 60 may include active regions 64P and 64N, and gate electrodes 62, 62' and 62". Each of the active regions 64P and 64N may include diffusion regions (e.g., source and drain regions) and channel regions (not shown) between the diffusion regions and below the gate electrodes 62, 62' and 62". Thus each of the gate electrodes 62, 62' and 62" may pass over the active regions 64P and 64N. Each of the plurality of transistors 610P, 611P and 612P may include diffusion regions (e.g., source and drain regions) in the active region 64P. Each of the plurality of transistors 610N, 611N, 612N, 613N, 614N and 615N may include diffusion regions (e.g., source and drain regions) in the active region 64N.

As shown in FIG. 6A, the logic circuit 60 may further include gate electrodes 62, 62' and 62" that are disposed over the active regions 64P and 64N. The gate electrodes 62 may include body gate portions 620BP, 620BN and 621BN and an input node 68, and may receive the input signal In1 at the input node 68. The transistor 610P may include the body gate portion 620BP over the active region 64P and the transistors 610N and 611N may include the body gate portions 620BN and 621BN respectively over the active region 64N. The transistors 610P, 610N and 611N may receive the input signal In1 at the body gate portions 620BP, 620BN and 621BN respectively. The gate electrodes 62' may include body gate portions 621BP', 622BN' and 623BN' and an input node 68', and may receive the input signal In2 at the input node 68'. The transistor 611P may include the body gate portion 621BP' over the active region 64P and the transistors 612N and 613N may include the body gate portions 622BN' and 623BN' respectively over the active region 64N. The transistors 611P, 612N and 613N may receive the input signal In2 at the body gate portions 621BP', 622BN' and 623BN' respectively. Similarly, the gate electrode 62" may include body gate portions 622BP", 624BN" and 62513N" of the transistors 612P, 614N and 615N and an input node 68" that may receive the input signal In3. The transistor 612P may include the body gate portion 622BP" over the active region 64P and the transistors 614N and 615N may include the body gate portions 624BN" and 625BN" respectively over the active region 64N. The transistors 612P, 614N and 615N may receive the input signal In1 at the body gate portions 622BP", 624BN" and 625BN" respectively.

The plurality of transistors 610P, 611P and 612P may share (e.g., commonly include) a terminal 66P in the active region 64P, coupled to a power supply voltage line providing a power supply voltage (e.g., Vdd). The plurality of transistors 610P, 611P and 612P may share (e.g., commonly include) a terminal 69P in the active region 64P is coupled to an output node Out 69 that may provide an output signal. Thus, the plurality of transistors 610P, 611P and 612P are parallel-coupled to each other between the power supply voltage line and the output node Out 69.

The plurality of transistors 614N and 615N may share (e.g., commonly include) a terminal 66N in the active region 64N coupled to another power supply voltage line providing another power supply voltage (e.g., Vss) that is different from the power supply voltage (e.g., Vdd). The plurality of transistors 610N and 611N may share (e.g., commonly include) a terminal 69N in the active region 64N, coupled to the output node Out 69. The transistor 612N may include one terminal coupled to a terminal of the transistor 610N different from the terminal 69N, and the terminal transistor 612N may include another terminal coupled to a terminal of the transistor 614N different from the terminal 66N. Thus, a combination of the transistors 610N, 612N and 614N may be coupled in series between the other power supply voltage (e.g., Vss) and the output node Out 69. Similarly, a combination of the transistors 611N, 613N and 615N may be coupled in series between the other power supply voltage and the output node Out 69. In the other words, the serially-coupled the transistors 610N, 612N and 614N and the serially-coupled the transistors 611N, 613N and 615N are parallel-coupled to each other between the other power supply voltage line and the output node Out 69. One of the diffusion regions (e.g., drain regions) in the active region 64P of the plurality of transistors 611P and 612P and the active region 64N of the plurality of transistors 610N, 611N, 612N, 613N, 614N and 615N may provide an output signal from either the terminal 69P of the active region 64P or the terminal 69N on the active region 64N to the output node Out 69.

If either the input signal In1, the input signal In2, or the input signal In3 is at a logic low level (e.g., "0"), either the transistor 610P, the transistor 611P or the transistor 612P, responsive to the input signal In1, the input signal 2 or the input signal In3, may couple the terminal 66P to the terminal 69P, thus the power supply voltage line providing a positive voltage (e.g., Vdd) may be coupled to the output node Out 69 to provide the output signal at a logic high level (e.g., "1"). Simultaneously, responsive to the input signal In2 or the input signal In3 is at the logic low level, either the plurality of transistors 610N and 611N, the plurality of transistors 612N and 613N or the plurality of transistors 614N and 615N may be deactivated and decouple the terminal 66N from the terminal 69N, thus the other power supply voltage line providing zero or negative voltage (e.g., Vss) is decoupled from the output node Out 69. Thus, responsive to either the input signal In1, the input signal In2 or the input signal In3 being at the logic low level, the output node Out 59 may provide the output signal at the logic high level. If all the input signals In1, In2 and In3 are at the logic high level, either the plurality of transistors 610N and 611N, the plurality of transistors 612N and 613N or the plurality of transistors 614N and 615N may be activated and may couple the terminal 66N to the terminal 69N, thus the zero or negative voltage (e.g., Vss) may be provided to the output node Out 69. At the same time, because all the input signals In1, In2 and In3 are at the logic high level, the plurality of transistors 610P, 611P and 612P may be deactivated and decouple the terminal 66P from the terminal 69P, thus the power supply voltage line providing a positive voltage (e.g., Vdd) is decoupled from the output node Out 69. Responsive to all the input signals In0, In1 and 1n2 being at the logic high level, the output node Out 69 may provide the output signal at the logic low level.

The gate electrode 62 may include hammer-head portions 62H, the gate electrode 62' may include hammer-head portions 62H', and the gate electrode 62" may include hammer-head portions 62H". The hammer-head portions 62H, 62H' and 62H" in contact with the respective body gate portions 620BP, 621BP' and 622BP' may be disposed to overlap a border of the active region 64P and an isolation region 75P (e.g., shallow trench isolation (STI) surrounding the active region 64P). Similarly, the hammer-head portions 62H in contact with the body gate portions 620BN and 621BN, the hammer-head portions 62H' in contact with the body gate portions 622BN' and 623BN", the hammer-head portions 62H" in contact with the body gate portions 624BN" and 625BN" may be disposed to overlap a border of the active region 64N and an isolation region 65N (e.g., shallow trench isolation (STI) surrounding the active region 64N). Each of hammer-head portions 62H may have a greater length in a gate length direction than a gate length of each adjacent body gate portion of the body gate portions 620BP, 62013N, 621BN in the gate length direction. Each of hammer-head portions 62H' may have a greater length in a gate length direction than a gate length of each adjacent body gate portion of the body gate portions 621BP', 622BN', 623BN' in the gate length direction. Similarly, each of hammer-head portions 62H" may have a greater length in a gate length direction than a gate length of each adjacent body gate portion of the body gate portions 622BP", 624BN", 625BN" in the gate length direction.

The gate electrode 62 includes lead-out portions 62L, the gate electrode 62' includes lead-out portions 62L' and the gate electrode 62" includes lead-out portions 62L". In FIG. 6A, for example, one of the lead-out portions 62L may be arranged in contact with the hammer-head portions 62H of the transistors 610P. Some of the lead-out portions 62L may be arranged in contact with the hammer-head portions 62H of the transistor 610N and the other of the lead-out portions 62L may be arranged in contact with the hammer-head portions 62H of the transistor 611N. One of the lead-out portions 62L' may be arranged in contact with one of the hammer-head portion 62H' of the transistor 611P. The other of the lead-out portions 62L' may be arranged in contact with the hammer-head portions 62H' of the transistors 612N and 613N. One of the lead-out portions 62L" may be arranged in contact with the hammer-head portions 62H" of the transistor 612P. The other lead-out portions 62L" may be arranged in contact with the hammer-head portions 62H" of the transistors 614N and 615N. Each of the lead-out portions 62L, 62L' and 62L" may have a greater gate length in the gate length direction than the gate length of each of the adjacent hammer-head portion of the hammer-head portions 62H, 62H' and 62H". Because the gate length of each hammer-head portion of the hammer-head portions 62H, 62H' and 62H" is less than the gate length of each adjacent lead-out portion of the lead-out portions 62L, 62L' and 62L", the leakage currents of the transistors 610P, 611P, 612P, 610N, 611N, 612N, 613N, 614N, and 615N through the active regions 64P and 56N due to the hammer-head portions 62H, 62H' and 62H" may be alleviated and may not significantly affect performance of the transistors 610P, 611P, 612P, 610N, 611N, 612N, 613N, 614N, and 615N.

The logic circuit 60 may further include dummy gate electrodes 63P and 63N. Similarly to the dummy gate electrodes 53P and 53N, the dummy gate electrodes 63P and 63N may be formed (or patterned) over the isolation regions 65P and 65N simultaneously with the gate electrodes 62, 62' and 62". As shown in FIG. 6A, the dummy gate electrodes 63P may be disposed parallel to the body gate portions 620BP, 621BP' and 62BP" of the gate electrodes 62, 62' and 62" on the active region 64P (e.g., in a direction perpendicular to a direction of a gate length). Similarly, the dummy gate electrodes 63N may be disposed parallel to the body gate portions 620BN, 621BN, 622BN' 623BN', 624BN" and 625BN" of the gate electrodes 62, 62' and 62" on the active region 64N. The lead-out portions 62L, 62L' and 62L" may be arranged to be outside a region between the dummy gate electrodes 63P and the hammer-head portions 62H, 62H' and 62H" on the border of the active region 64P and the isolation region 65P, as well as outside of a region between the dummy gate electrodes 63N and the hammer-head portions 62H, 62H' and 62H" on the border of the active region 64N and the isolation region 65N. By having the lead-out portions 62L, 62L' and 62L" that have greater gate lengths than the gate lengths of the corresponding hammer-head portions 62H, 62H' and 62H", outside a region between the dummy gate electrodes 63P as well as outside a region between the dummy gate electrodes 63N (e.g., not surrounded by the dummy gate electrodes 63P, 63N), the lead-out portions 62L, 62L' and 62L" may reduce undesirable variations (e.g., crack, deformation) in a region lacking the dummy gate electrodes 63P, 63N around in manufacturing processes.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present disclosure herein should not be limited by the particular disclosed embodiments described above.

What is claimed is:

1. A device comprising:
an active region surrounded by an isolation region;
a dummy gate over the isolation region, the dummy gate extending in a first direction adjacently to the active region; and
a gate electrode extending in parallel to the dummy gate to pass over the active region, wherein the gate electrode comprises:
a first portion over the active region, the first portion having a first dimension in a second direction that is perpendicular to the first direction,
a second portion covering a portion of a first border between the active region and the isolation region, the second portion having a second dimension in the second direction, the second dimension being greater than the first dimension, and
a third portion over the isolation region, the third portion having a third dimension in the second direction, the third dimension being greater than the second dimension.

2. The device of claim 1,
wherein the dummy gate has an end termination over the isolation region, and
wherein a second border between the second and third portions is proximate to a line extending in the second direction from the end termination of the dummy gate.

3. The device of claim 2,
wherein the second border between the second and third portions is on the line extending in the second direction from the end termination of the dummy gate.

4. The device of claim 2, wherein a distance between the second border and the first border is less than a distance between the line and the first border.

5. The device of claim 2, wherein a distance between the second border and the first border is greater than a distance between the line and the first border.

6. An apparatus comprising:
an active region surrounded by an isolation region; and
a gate electrode extending in a first direction to pass over the active region, wherein the gate electrode includes:
a first portion over the active region, the first portion having a first gate length in a second direction perpendicular to the first direction;
a second portion over the isolation region, the second portion having a second gate length in the second direction, the second gate length being greater than the first gate length; and
a third portion having a first end in contact with the first portion and a second end opposite to the first end in contact with the second portion,
wherein the third portion has a third gate length in the second direction, the third gate length being greater than the first gate length and less than the second gate length,
wherein the third portion overlaps a border of the active region and the isolation region,
wherein the first portion has a plurality of first sides along the first direction, wherein a first distance is between the pluralities of the first sides,
wherein the second portion has a plurality of second sides along the first direction, wherein a second distance between the plurality of second sides is greater than the first distance, and
wherein the third portion has a plurality of third sides connecting the first portion and the second portion.

7. The apparatus of claim 6, wherein the plurality of third sides extend along the second direction, and have a third distance that is greater than the first distance and less than the second distance.

8. The apparatus of claim 6, wherein a third side of the plurality of third sides connects a first side of the first sides and a second side of the second sides.

9. The apparatus of claim 8, wherein the third side has a shape of a line segment.

10. The apparatus of claim 8, wherein the third side has a shape of an arc.

11. An apparatus comprising:
an active region surrounded by an isolation region; and
a gate electrode extending in a first direction to pass over the active region, wherein the gate electrode includes:
a first portion over the active region, the first portion having a first gate length in a second direction perpendicular to the first direction;
a second portion over the isolation region, the second portion having a second gate length in the second direction, the second gate length being greater than the first gate length;
a third portion having a first end in contact with the first portion and a second end opposite to the first end in contact with the second portion; and
a plurality of dummy gate electrodes over the isolation region adjacent to the active region and parallel to the gate electrode,
wherein the third portion has a third gate length in the second direction, the third gate length being greater than the first gate length and less than the second gate length,
wherein the third portion overlaps a border of the active region and the isolation region,
wherein each dummy gate electrode of the plurality of dummy gate electrodes has an end and has a first side along the first direction facing the active region, and
wherein the second portion is disposed outside of a region defined by a second side extending in the first direction from the end of the dummy gate electrodes and the first sides of the plurality of dummy gate electrodes.

12. The apparatus of claim 11, wherein a border between the second portion and the third portion is proximate to the second side.

* * * * *